United States Patent
Krause et al.

(10) Patent No.: US 6,937,493 B2
(45) Date of Patent: Aug. 30, 2005

(54) PROGRAMMING FLASH MEMORY VIA A BOUNDARY SCAN REGISTER

(75) Inventors: Karlheinz Krause, Planegg (DE); Elke Tiemeyer, Munich (DE)

(73) Assignee: Siemens Aktiengesellschaft, Munich (DE)

(*) Notice: Subject to any disclaimer, the term of this patent is extended or adjusted under 35 U.S.C. 154(b) by 146 days.

(21) Appl. No.: 10/668,603

(22) Filed: Sep. 24, 2003

(65) Prior Publication Data

US 2004/0130944 A1 Jul. 8, 2004

(30) Foreign Application Priority Data

Sep. 25, 2002 (DE) .......................................... 102 44 757

(51) Int. Cl.[7] ................................................ G11C 5/06
(52) U.S. Cl. ............... 365/63; 365/189.02; 365/189.05; 714/727
(58) Field of Search ............................. 365/63, 189.02, 365/189.05; 714/727

(56) References Cited

U.S. PATENT DOCUMENTS

| | | | | |
|---|---|---|---|---|
| 5,281,864 A | * | 1/1994 | Hahn et al. ................. | 327/202 |
| 5,325,368 A | * | 6/1994 | James et al. ................ | 714/727 |
| 6,173,428 B1 | * | 1/2001 | West .......................... | 714/727 |
| 6,499,124 B1 | * | 12/2002 | Jacobson .................... | 714/727 |
| 6,774,672 B1 | * | 8/2004 | Lien et al. ................... | 326/47 |

* cited by examiner

*Primary Examiner*—Son T. Dinh
(74) *Attorney, Agent, or Firm*—Morrison & Foerster LLP

(57) ABSTRACT

A method and parallel interface for on-board programming and/or In-System Configuration of a flash memory mounted on a printed circuit board by controlling its inputs with the aid of an ASIC mounted on the same circuit board via a Boundary Scan register of which the output signals are provided for activating or deactivating a write operation. The architecture description of the ASIC, flash memory, and the data format of the program and configuration data are stored in a Boundary-Scan Description Language file. The circuit board can be controlled via a JTAG interface suitable for performing function testing of the flash memory for input or output of standard bus signals and for input of the control signals of the ASIC. To reduce the programming effort, the data of the circuit diagram or of the network list derived from it is stored in the BSDL file.

10 Claims, 4 Drawing Sheets

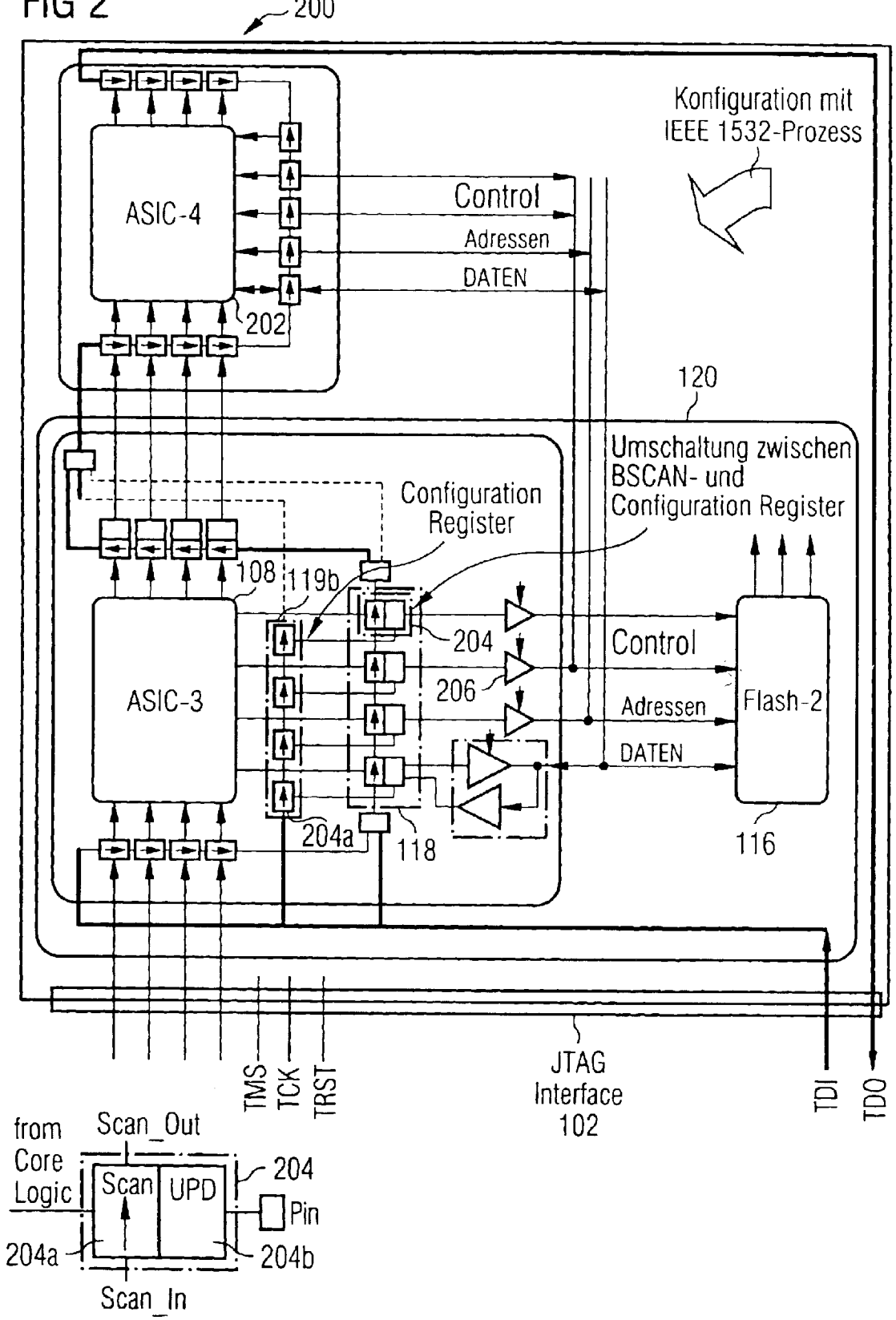

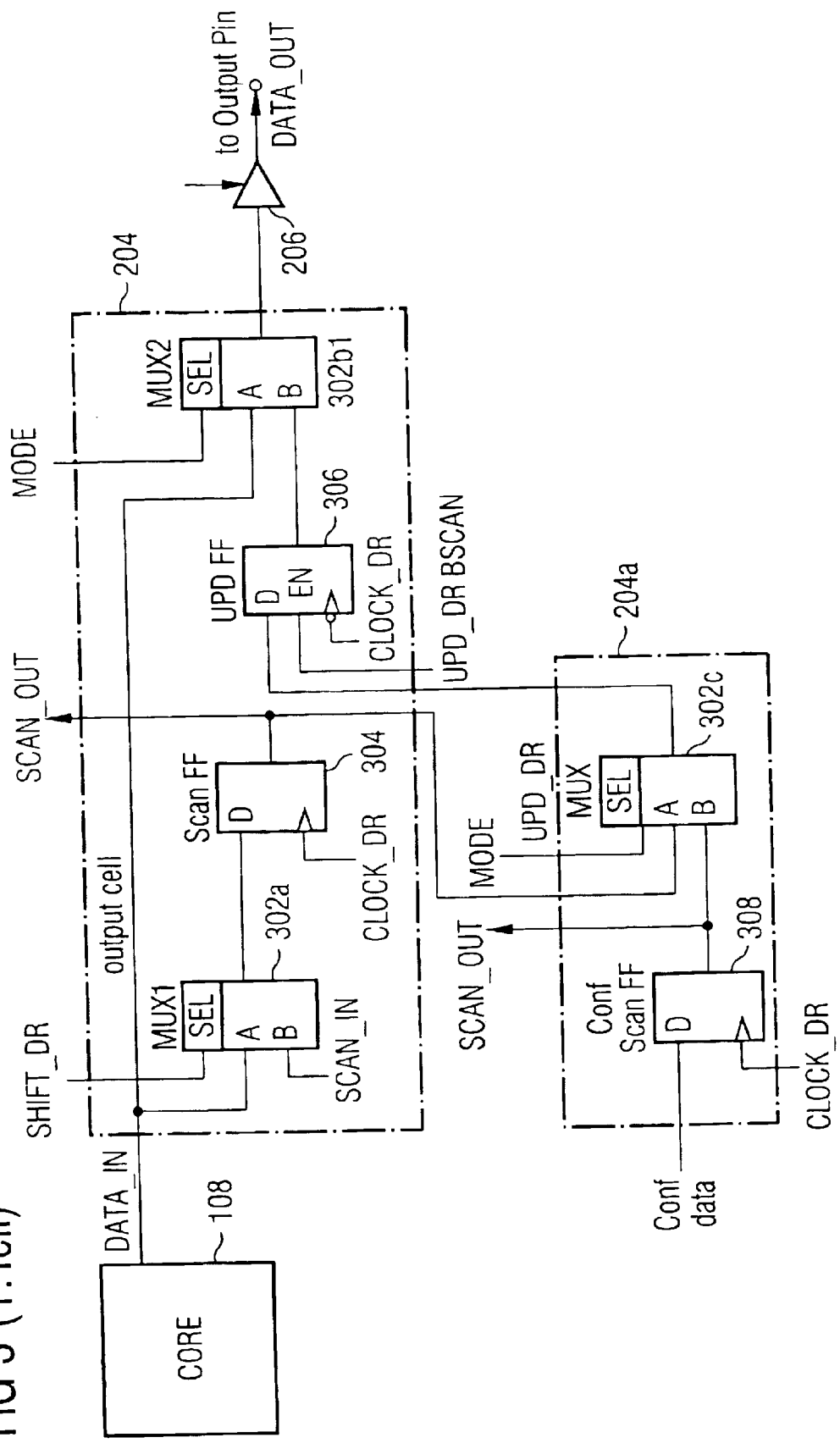
FIG 3 (1.Teil)

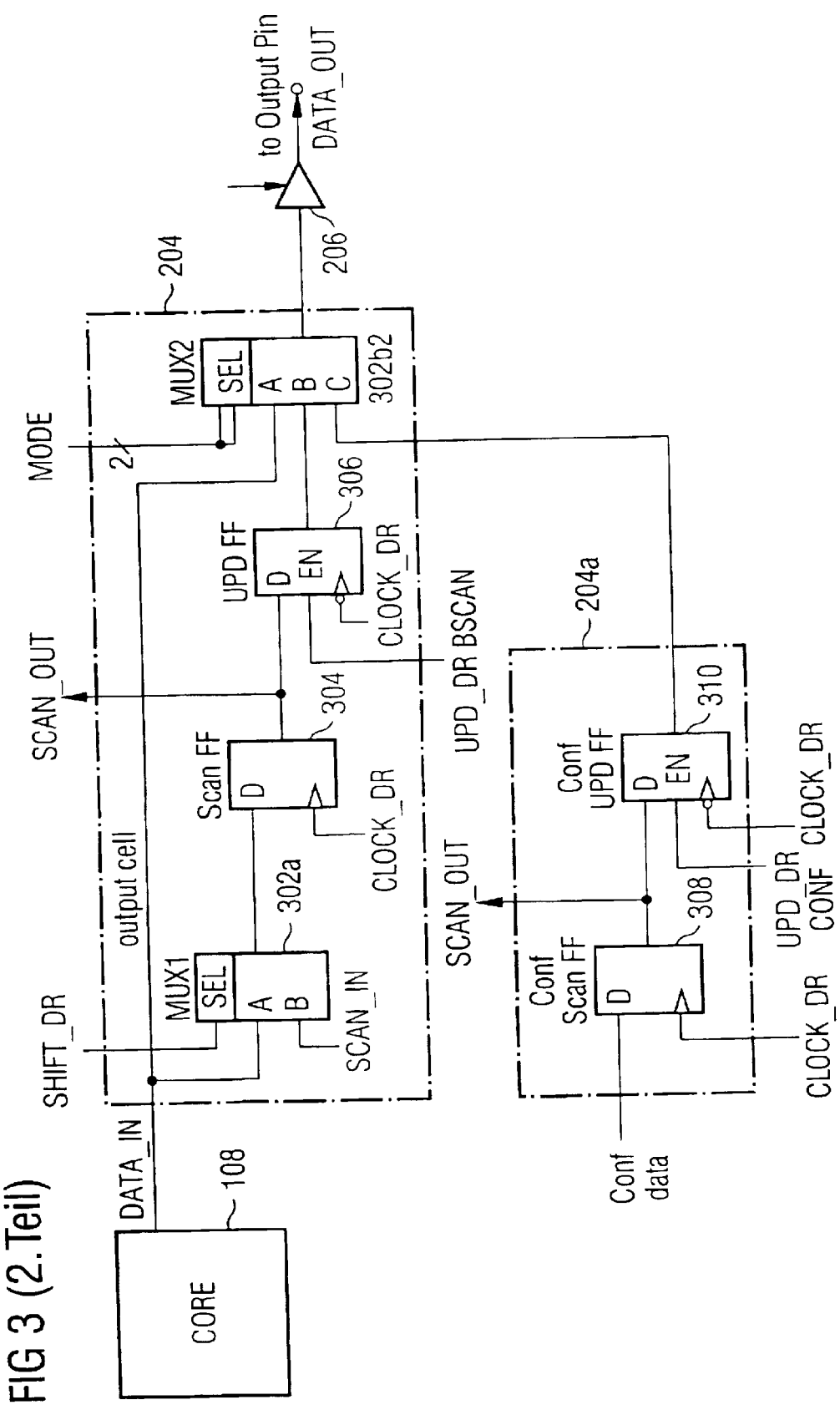
FIG 3 (2.Teil)

PROGRAMMING FLASH MEMORY VIA A BOUNDARY SCAN REGISTER

CLAIM FOR PRIORITY

This application claims priority to German Application No. 10244757.8, filed Sep. 25, 2002, the contents of which are hereby incorporated by reference.

TECHNICAL FIELD OF THE INVENTION

The underlying invention is based on a method and an interface for on-board programming and/or In-System Configuration (ISC) of flash memory mounted on a printed circuit board by controlling its inputs with the aid of an application-specific integrated circuit mounted on the same circuit board via a Boundary Scan (BSCAN) register of which the outputs are provided for activating or deactivating a write operation.

BACKGROUND OF THE INVENTION

The Boundary Scan technique (BSCAN) is a standardized method for board tests, that was formally approved in 1990 as industry standard IEEE 1149.1 for Test Access Port (TAP) and Boundary Scan (BSCAN) architectures. Connection tests at board level in the production of complex printed circuit boards (PCBs) are based on this specification. If the test object has its own microprocessor as well as flash-based program memory, a built-In self test can be implemented for example by loading the flash memory via Boundary Scan with the aid of a self-test program. Test results stored in memory can be read out again by Boundary Scan after the ending of the test procedure in this case.

To execute Boundary Scan tests two conditions must be fulfilled: At least a few of the integrated circuits (ICs) on the board must comply with the BSCAN specification. In the testing test vectors will then be used to have the desired test executed by a BSCAN register. In addition the product developers must provide a scan path between the individual ICs which leads from the Test Access Port (TAP) through the ICs back to the TAP where the data is finally scanned. For testing electrical connections Boundary Scan tests represent an excellent alternative to in-circuit tests (ICTs). The costs of performing function testing are low, and because of the increasing miniaturization of integrated semiconductor components the assumption is that the trend towards boundary scan will continue.

IEEE-Standard 1149.1 specifies both the necessary hardware structures and also a suitable form of description of all these characteristics in the form of the Boundary Scan Description Language (BSDL). In this case, this standard is kept so open that by definition of customer-specific registers and corresponding instructions application-specific functions can be implemented without losing compatibility. This is precisely the basic premise on which all conventional procedures for in-system programming (ISP) of integrated ASICs which operate on the basis of Boundary Scan are also based, but to date no standard for this has existed. Nor is there a uniform definition of test vector formats for data interchange contained in IEEE-Standard 1149.1.

Whereas the Boundary Scan method in accordance with IEEE-Standard 1149.1 was previously primarily used as an innovative technology for function testing of integrated circuits or for verification and simulation of hardware fault functions, the most recent developments show further possible applications of this principle. As well as use for test purposes, Boundary Scan will also be used very effectively in the area of what is known as In-System-Programming (ISP) of flash memories as well as Programmable Logic Device (PLD) chips, such as Field-Programmable Gate Arrays (FPGAs) with up to 10,000 logic gates per array or Programmable Logic Arrays (PLAs). In this case the individual control and address inputs of a flash memory will be simulated via the chained BSCAN cells of a BSCAN register assigned to these inputs in such a way that either a read or a write operation will be triggered. As can be seen from the basic diagram shown in FIG. 1, the control, address and data signals of the corresponding BSCAN cells can be recorded and output.

IEEE-Standard 1532 published in January 2001 created for the first time a uniform set of standards for the system architecture and a suitable data format for In-System Configuration (ISC) of programmable integrated ASICs. This Standard describes a series of obligatory and optional programming instructions and corresponding data registers. In principle IEEE Standard 1532 represents an expansion of IEEE Standard 1149.1 specifically tailored to the requirements of programming for standardizing the programming process for programmable logic chips, but is fully compatible with the latter. Since IEEE Standard 1532 related exclusively to programmable logic chips however which feature a JTAG interface and are able to store programming data internally, this standard does not relate to flash memory without a JTAG interface. Basically IEEE Standard 1532 includes the standardization of specific ISC data registers, ISC instructions, BSDL expansions for the description of the ISC features as well as a specific file format.

This means that Standard IEEE 1532 goes far beyond all previous solutions and, on the basis of its innovative character, also allows simultaneous programming of a number of compatible components. By using a series of additional functions, such as the use of special program voltage pins, complianceenable pins and the possibility of defining optional ISC instructions, IEEE 1532 also offers the necessary scope for creating application-specific compatibilities. With IEEE Standard 1532 this basically involves a methodical separation of process information and programming files.

The component information needed for programming is contained in corresponding "BSDL expansions" of a BSDL file. A quite major component from the user's standpoint here is what is known as the "Attribute ISC_Flow". This implements the basic programming functions such as Delete, Program, Verify etc., in corresponding test sequences. If a number of IEEE-1532-compatible components are to be programmed simultaneously, the programming software must have the capability to virtually merge any number of "Attribute ISC_Flows". Because of this methodology IEEE Standard 1532 provides the facility for programming PLDs from different manufacturers independent of the process technology (e.g. EEPROM, SRAM or flash-based), their architecture or their voltage level.

The BSDL files must be provided type-specifically by the relevant chip manufacturer. In this regard they are a quite significant part of the delivery scope. By contrast the programming data is created individually by the PLD designer via a corresponding target compiler in the form of a data file. Without going into more detail it should merely be mentioned that this involves ASCII files with a specific syntax so that they can be read and edited. In accordance with this function principle, for each component to be programmed there must be a BDSL file and a data file consistent with it available.

Even if the previously described theory of IEEE Standards 1532 appears to promise much, it is in no way sufficient for the practical success of this Standard. The programming software in particular occupies a key position because of the multiplicity of functions necessary and has a decisive effect on determining the efficiency of the ISC operations.

For simultaneous programming of a number of components the time savings that can be achieved depend on a number of different factors. Particular factors to mention here are the complexity, architecture, technology and clock rate of the component involved. To this extent verifiable quantitative statements also depend on the relevant implementation and application.

With Boundary Scan in particular the continuing development of the software tools plays a decisive role for effective implementation of this trailblazing technology in practice. In conjunction with BSCAN-based on-board programming of flash memories, the prior art in this case is especially the integrated development and programming environment system CASCON™ from GÖPEL electronic GmbH of Jena.

To combine the new programming methods with other BSCAN procedures such as debugging, production tests or flash programming, GÖPEL provides a J-Drive program engine that is included for In-System Configuration (ISC) of a PLD directly in the Boundary Scan software package system CASCON™ and POLARIS™ This J-Drive program Engine accesses configuration data from a BSDL file for configuration of a Test Access Port (TAP) according to IEEE Standard 1149.1 which will be used as a control unit to control the BSCAN cells of the BSCAN register via a program interface. In connection with the available controllers based on USB, PCI, PXI or VXI, this allows cost-optimized multi-mode boundary scan systems to be configured with performance tailored for labor, production and service. This makes it possible for example in production to test with just one device a PLD mounted on a circuit board for manufacturing faults, then to configure the PLD and to load a specific production version of the firmware into an available flash memory.

According to the prior art, flash memories are programmed as a rule with the aid of application-specific integrated circuits (ASICs) which are in a position to configure the flash memory involved even during operation. As a rule these are ASICs which support the JTAG Standard IEEE 1149.1 (cf. FIG. 1: Interface between ASIC-1 and Flash-1). For this purpose an abbreviated BSCAN register is used where necessary, with the aid of which the period required for programming the flash memory can be decisively shortened.

However using this method produces a number of problems: Thus for example for programming a flash memory creation of a program is relatively expensive since the configuration (i.e. the connections between ASIC and Flash memory) is taken from the circuit diagram or from the network list derived from it and the BSDL file of the ASIC must be included. Furthermore simultaneous programming of a number of integrated semiconductor components mounted on the same circuit board is not currently possible. Above and beyond this, with conventional methods burst mode is also not possible since with each write cycle the programming data has to be shifted into the ASIC as well as the addresses and the control bits too as a rule.

SUMMARY OF THE INVENTION

The present invention provides a method of on-board programming as well as In-System Configuration (ISC) of flash memory by stimulating individual of its inputs via memory cells of a BSCAN register to activate or deactivate a write operation, for which application the circuit diagram needed for on-board programming or the network list derived from it no longer needs to be included.

Furthermore simultaneous programming of a number of flash memories mounted on the same circuit board should also be made possible, even in burst mode.

In one embodiment of the invention, there is a method as a well as a parallel interface for on-board programming and/or In-System Configuration (ISC) of a flash memory mounted on a printed circuit board is provided by controlling individual inputs of the flash memory with the aid of an application-specific integrated circuit mounted on the same circuit board via individual memory cells of a BSCAN register to activate or deactivate a write operation. In this case, the architecture description of the ASIC and of the flash memory to be programmed as well as the data format of the program (DATA_IN) and configuration data (Conf data) are stored in a BSDL file. The circuit board can be controlled via a JTAG interface for input or output of standard bus signals (TDI, TDO, TMS, TCK and TRST) suitable for performing function testing of the flash memory as well as for input of the control signals of the ASIC.

To reduce the programming effort, in accordance with the invention, the data of the circuit diagram or of the network list derived from it, which defines the configuration of the interface between the flash memory to be programmed and the ASIC, is stored in a further file (BSDL file) so that the flash memory to be programmed, after adaptation of the features of the flash memory to IEEE Standard 1532 can be programmed via a JTAG interface in the same way as a programmable logic device (PLD).

BRIEF DESCRIPTION OF THE DRAWINGS

Further features, characteristics, benefits and applications of the underlying invention are described in the following description of exemplary embodiments of the invention which are shown in FIGS. 1 to 3. The diagrams show:

FIG. 2 shows a reduced circuit layout of the same PCB for programming and configuration of an integrated flash memory via a BSCAN register via a JTAG interface based on a BSDL file according to Standard IEEE 1532, whereby a configuration register according to IEEE Standard 1532 is connected to the output of an application-specific integrated circuit.

FIG. 3 shows detailed views of two exemplary embodiments of the circuit layout for connecting the multiplexes and flip-flops of a scan cell of the BSCAN register and a capture cell of the configuration register for provision of the control, data and address signals needed for programming the flash memory.

DETAILED DESCRIPTION OF THE INVENTION

Figure 1:
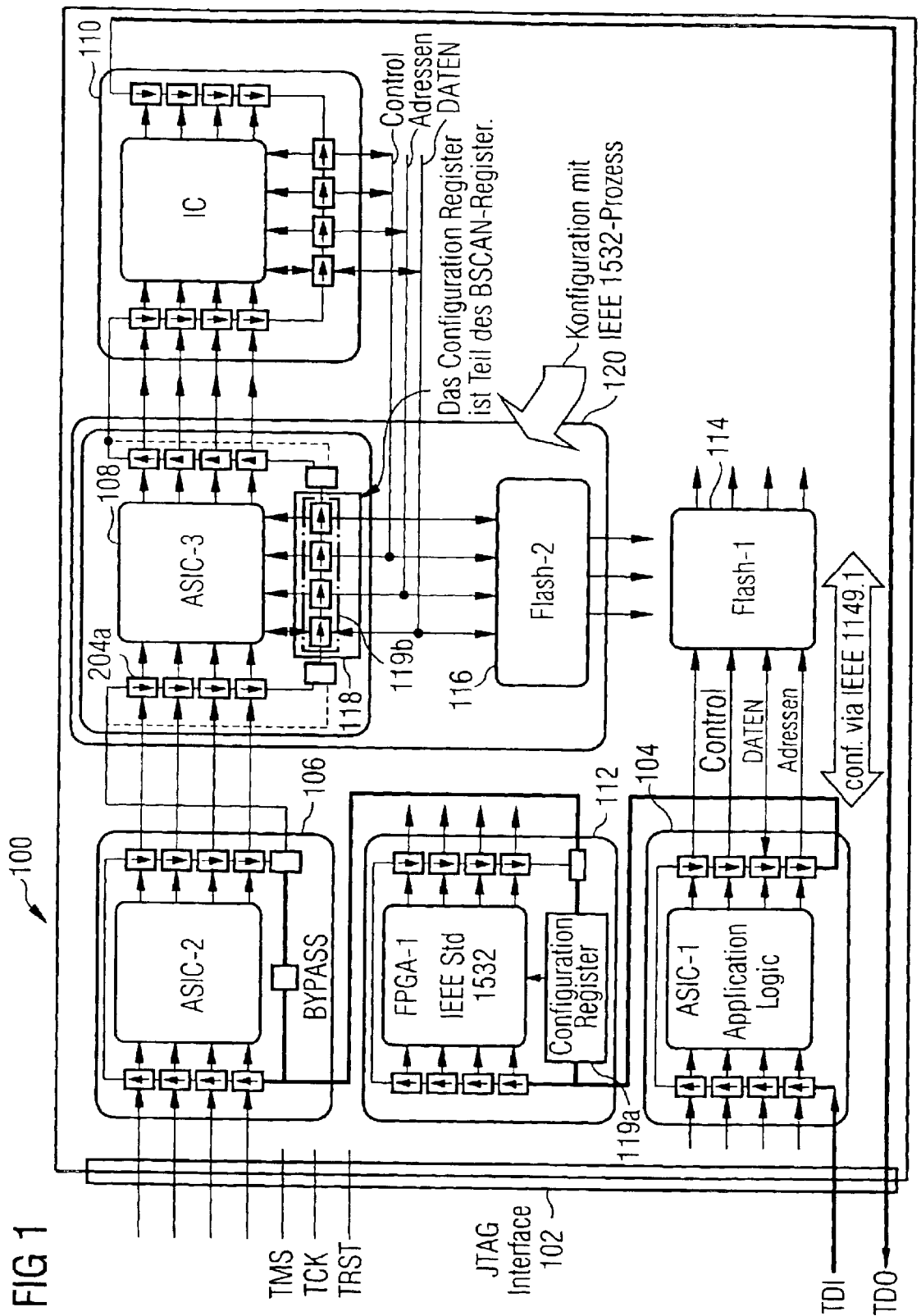
FIG. 1 Shows a circuit layout of a Printed Circuit Board (PCB), which is suitable for programming and configuration of two flash memories via a Boundary Scan (BSCAN) register via a JTAG interface according to Standard IEEE 1532, whereby the interface between the ASIC and the second flash memory is formed by a part of the BSCAN register.

The invention is explained in more detail below using the exemplary embodiments illustrated in FIGS. 1 to 3. The meaning of the symbols provided with reference numbers in FIGS. 1 to 3 can be taken from the enclosed list of reference numbers.

Within the context of an exemplary embodiment of the present invention there is provision for an ASIC 108, suitably adapted for on-board programming and In-System Configuration (ISC) of a flash memory 116, which can be controlled via a JTAG interface 102 in accordance with IEEE Standard 1149.1 and reprograms or configures the flash memory 116 even during operation. In accordance with the invention, ASIC 108 and flash memory to be programmed 116 are considered with the context of IEEE Standard 1532 as contiguous unit 120 (see FIGS. 1 and 2). As a result it makes no difference whether flash memory 116 is inside or outside ASIC 108.

If one gives this ASIC 108 characteristics in accordance with IEEE Standard 1532, the flash memory 116 can be programmed in the same way as a programmable logic device (PLD). In this case, the data of the circuit diagram or of the network list that can be derived from it which defines the configuration of interface 118 and 119b between flash memory to be programmed 116 and ASIC 108 is stored in the BSDL file. The benefits of this are as follows:

Since the BSDL file now includes information for programming flash memory 116 the circuit diagram or the network lists derived from it no longer have to be included for program creation. Thus the programming algorithm, as with programmable logic devices (PLDs) can be generated automatically by JTAG tools, such as the BSCAN software package system CASCON™ from GÖPEL electronic GmbH.

Further simultaneous programming and/or configuration of a number of ASICs 114, 116 mounted on the same circuit board 100 is possible, which means that even during production of the circuit board 100 a significant cost reduction can be achieved.

Over and above this the underlying invention also makes possible, after connection of a configuration register 119b for buffering address and control data that occur at the outputs of the ASIC 108 provided for programming the flash memory 116, the programming or configuration of the flash memory 116 in burst mode.

IEEE-Standard 1532 allows a number of options for provision of control, data and address information via JTAG interface 102. In an exemplary embodiment of the present invention the "Memory Array" of a PLD specified in accordance with IEEE Standard 1532 which includes the configuration data which defines the programmed functions of the PLD is replaced by a parallel interface 118, 119b (external Memory Array) to an external flash memory 116. This in its turn offers a number of options:

The parallel interface between the ASIC 108 and the flash memory to be programmed 116 will be formed by connecting in series a number of memory cells 204a which are part of the BSCAN register 118 (see FIG. 1).

Alternatively, a configuration register 119b suitably adapted for In-System Configuration (ISC) of the flash memory to be programmed 116, such as one of the ISC_PData or ISC_RData registers specified according to IEEE Standard 1532 can be connected to the outputs of ASIC 108 as a parallel interface between ASIC 108 and the flash memory to be programmed 116 (see FIG. 2). As shown in FIG. 3, the option of three different connections is then possible:

a) connecting the control, data and/or addressing inputs of the flash memory to be programmed 116 to ASIC 108 (normal mode), b) connecting the control, data and/or addressing inputs of the flash memory to be programmed 116 to a signal input for BSCAN test data (SCAN_IN) for function testing of the flash memory, or c) connecting the control, data and/or addressing inputs of the flash memory to be programmed 116 with the configuration register 119b for configuration of the flash memory with the aid of the configuration data stored in the BSDL file.

This is achieved by modification of BSCAN cell 204, as shown in FIG. 3. In accordance with the invention, this type of BSCAN cell 204 has an input multiplexer 302a for switching a through connection of one of at least two input signals (DATA_IN, SCAN_IN) depending on a control signal (SHIFT_DR) present at a control signal input (SEL) which allows the option of a connection from ASIC 108 or from a signal input for SCAN test data (SCAN_IN) to flash memory 116. A scan or capture flip-flop 304 is used to buffer the programming data received from ASIC 108 (DATA_IN) or the BSCAN test data (SCAN_IN). For initiating or ending a write operation an update flip-flop 306 is used, with the aid of which individual control signals, data and/or address inputs of the flash memory 116 are controlled. Via an output multiplexer 302b1 or 302b2 for through connecting one of at least two input signals (DATA_IN, SCAN_OUT, conf data), depending on a control signal (MODE) present at a control signal input (SEL), there is the option of switching through a connection from ASIC 108 or from a signal input for configuration data (Conf data) to flash memory 116.

A scan or capture cell 204a of configuration register 119b for In-System Configuration (ISC) of Flash memory 116 consists in accordance with the first exemplary embodiment of the present invention of a scan or capture flip-flop 308 for buffering the data received from ASIC 108 (Conf data) and an output multiplexer 302c for through connecting one of two input signals (SCAN_OUT, Conf data) depending on a control signal (UPD_DR) present at a control signal input (SEL). This gives the option of switching a connection from ASIC 108, from a signal input for BSCAN test data (SCAN_IN) or from a signal input for configuration data (Conf data) through to flash memory 116.

In accordance with a second exemplary embodiment of the present invention, instead of output multiplexer 302c an update flip-flop 306 is used for controlling individual control signal, data and/or address inputs of flash memory 116 in order to trigger or end a write operation.

The decisive advantage of the present invention over conventional methods of on-board programming according to the prior art lies in the fact that with the aid of the method in accordance with the invention the differences between flash and PLD programming are eliminated. In this case, ASIC 108 and flash memory 116 form one unit within the context of IEEE Standard 1532. The fact that the circuit characteristics are stored in the BSDL file also gives the user the benefit of a significant reduction in programming effort, since the connections between ASIC 108 and flash memory 116 no longer have to be taken from the circuit diagram or from the network lists derived from it.

List of Reference Symbols

100 Circuit layout of a Printed Circuit Board (PCBs) which is suitable for programming and configuration of two flash memories 114 and 116 (Flash-1, Flash-2) via a Boundary Scan (BSCAN) register 118 via JTAG interface 102 in accordance with Standard IEEE 1532, whereby the interface between the ASIC 108 and the second flash memeory 116 (Flash-2) is formed by a part of the BSCAN register

102 JTAG interface of PCB 100 for input and output of standard bus signals TDI, TDO, TMS, TCK and TRST as well as for input of the control signals of the second application-specific integrated circuit 106 (ASIC-2)

104 first application-specific integrated circuit (ASIC-1) to accept the TDI signal via JTAG interface 102 and programming of the first flash memory 114 (Flash-1) via an interface in accordance with the IEEE 1149.1 Standard and control of the Field-Programmable Gate Array 112 (FPGA-1) via a configuration register 119*a*

106 second application-specific integrated circuit (ASIC-2) without configuration register, controllable via the Field-Programmable Gate Array 112 (FPGA-1)

108 third application-specific integrated circuit (ASIC-3) for programming the second Flash memory (Flash-2) via a BSCAN register 118 in accordance with the IEEE 1532 Standard

110 integrated circuit (IC) for output of the TDO signal via JTAG interface 102

112 Field-Programmable Gate Array (FPGA-1), for configuration controllable via a configuration register 119*a*

114 first flash memory (Flash-1), programmable with the aid of the first application-specific integrated circuit 104 (ASIC-1)

116 second flahs memory (Flash-2), programmable with the aid of the third application-specific integrated circuit 108 (ASIC-3) via a BSCAN register 118

118 Boundary Scan (BSCAN) register, needed for programming the second flash memory 116 (Flash-2) with the aid of the third application-specific integrated circuit 108 (ASIC-3)

119*a* Configuration register, needed for configuration of the Field-Programmable Gate Array 112 (FPGA-1)

119*b* Configuration register, needed for programming the second flash memory 116 (Flash-2) with the aid of the third application-specific integrated circuit 108 (ASIC-3)

120 combined unit to be considered as a unit consisting of the third application-specific integrated circuit 108 (ASIC-3), the second flash memory to be programmed 116 (Flash-2), the configuration register 119*b* as well as the BSCAN register 118

200 reduced circuit layout of a Printed Circuit Board (PCBs) for programming and configuration of an integrated flash memory 116 (Flash-2) via a Boundary Scan (BSCAN) register 118 via JTAG interface 102 based on a Boundary Scan Description Language (BSDL) file in accordance with Standard IEEE 1532, whereby a configuration register 119*b* in accordance with IEEE Standard 1532 is connected to the output of the third application-specific integrated circuit 108(ASIC-3)

202 fourth application-specific integrated circuit (ASIC-4) for output of the TDO signal via JTAG interface 102

204 combined cell of BSCAN registers 118, consisting of the interconnection of a capture cell 204*a* and a scan cell 204*b*

204*a* Scan or capture cell of configuration register 119*b* for buffering configuration data or capture cell of BSCAN register 118 for buffering the programming data received form the third application-specific integrated circuit (ASIC-3)

204*b* Scan or capture cell of BSCAN register 118, needed for controlling a control signal, address or data input of the second flash memory to be programmed 116 (Flash-2)

206 output-side operational amplifier with adjustable gain factor (VGA) at the output of the scan cell 204*b* of BSCAN registers 118 responsible for the generation of the relevant control, address or data signal

300 Detailed views of two exemplary embodiments of circuit layout 200 for connecting multiplexers 302*a*, 302*b*1/302*b*2, 302*c* and flip-flops 304, 306, 308 of a scan cell 204*b* of BSCAN registers 118 and a capture cell 204*a* of configuration register 119*b* for providing the control, data and address signals needed for programming the flash memory 116 (Flash-2)

Variant 1: Use of the first exemplary embodiment 302*b*1 of the output multiplexer (MUX2)

Variant 2: Use of the second exemplary embodiment 302*b*2 of the output multiplexer (MUX2) and use of configuration update flip-flops 310 (Conf UPD-FF) at the output of capture cells 204*a* of configuration register 119*b*

302*a* Input mulitplexer (MUX1) of a capture cell 204*a* of BSCAN register 118 for through connecting one of two input signals (DATA_IN, SCAN_IN) depending on a selection signal (SHIFT_DR) present at a control signal input (SEL)

302*b* first variant of the output mulitplexer (MUX2) of a scan cell 204*b* of BSCAN register 118 for through connecting one of two input signals (DATA_IN, Conf data) depending on a selection signal (MODE) present at a control signal input (SEL)

302*b* second variant of the output multiplexer (MUX2) of a scan cell 204*b* of BSCAN register 118 for through connecting one of three input signals (DATA_IN, SCAN_OUT, Conf data) in depending on a selection signal (MODE) Present at a control signal input (SEL)

302*c* Output multiplexer (MUX) of a capture cell 204*a* of configuration register 119 for through connecting one of two input signals (SCAN_OUT, Conf. data) depending on a selection signal (UPD_) present at a control signal input (SEL)

304 Scan or capture flip-flop (Scan FF) of a capture cell 204*a* of BSCAN register 118, realized as an edge-triggered delay (D) flip-flop

306 Update flip-flop (UPD-FF) of a scan cell 204*b* of BSCAN register 118, realized as a edge-triggered delay (D) flip-flop with inverting clock signal input and a signal input for an ENABLE signal (UPD_DR BSCAN)

308 Configuration scan or configuration capture flip-flop (Conf Scan-FF) of a capture cell 204*a* of configuration register 119*b*, realized as a edge-triggered delay (D) flip-flop

310 Configuration updata flip-flop (Conf UPD-FF) of a capture cell 204*a* of configuration register 119*b*, realized as a edge-triggered delay (D) flip-flop with signal input for an ENABLE signal (UPD_ DR CONF) with inverting clock signal input TCK Standard bus signal "Test Clock" of the Test Access Port (TAP) for clocking the TAP controller in accordance with IEEE Standard 1149.1

TDI Standard bus signal "Test Data In" of the Test Access Port (TAP) for serial shifting in of data via JTAG interface 102 in accordance with IEEE Standard 1149.1

TDO Standard bus signal "Test Data Out" of the Test Access Port (TAP) for serial shifting out of data via JTAG interface 102 in accordance with IEEE Standard 1149.1

TMS Standard bus signal "Test Mode Select" of the Test Access Port (TAP) for switching over the states of the TAP controller in accordance with IEEE Standard 1149.1

| No. | Technical component or Functional characteristic |
|---|---|
| 100 | Circuit layout of a Printed Circuit Board (PCBs) which is suitable for programming and configuration of two flash memories 114 and 116 (Flash-1, Flash-2) via a Boundary Scan (BSCAN) register 118 via JTAG interface 102 in accordance with Standard IEEE 1532, whereby the interface between the ASIC 108 and the second flash memory 116 (Flash-2) is formed by a part of the BSCAN register |
| 102 | JTAG interface of PCB 100 for input and output of standard bus signals TDI, TDO, TMS, TCK and TRST as well as for input of the control signals of the second application-specific integrated circuit 106 (ASIC-2) |
| 104 | first application-specific integrated circuit (ASIC-1) to accept the TDI signal via JTAG interface 102 and programming of the first flash memory 114 (Flash-1) via an interface in accordance with the IEEE 1149.1 Standard and control of the Field-Programmable Gate Array 112 (FPGA-1) via a configuration register 119a |
| 106 | second application-specific integrated circuit (ASIC-2) without configuration register, controllable via the Field-Programmable Gate Array 112 (FPGA-1) |
| 108 | third application-specific integrated circuit (ASIC-3) for programming of the second Flash memory (Flash-2) via a BSCAN register 118 in accordance with the IEEE 1532 Standard |
| 110 | integrated circuit (IC) for output of the TDO signal via JTAG interface 102 |
| 112 | Field-Programmable Gate Array (FGPA-1), for confiuration controllable via a configuration register 119a |
| 114 | first flash memory (Flash-1), programmable with the aid of the first application-specific intetgrated circuit 104 (ASIC-1) |
| 116 | second flash memory (Flash-2), programmable with the aid of the third application-specific intetgrated circuit 108 (ASIC-3) via a BSCAN register 118 |
| 118 | Boundary Scan (BSCAN) register, needed for programming the second flash memory 116 (Flash-2) with the aid of the third application-specific integrated circuit 108 (ASIC-3) |
| 119a | Configuration register, needed for configuration of the Field-Programmable Gate Array 112 (FPGA-1) |
| 119b | Configuration register, needed for the programming the second flash memory 116 (Flash-2) with the aid of the third application-specific integrated circuit 108 (ASIC-3) |
| 120 | combined unit to be considered as a unit consisting of the third application-specific integrated circuit 108 (ASIC-3), the second flash memory to be programmed 116 (Flash-2), the configuration register 119b as well as the BSCAN register 118 |
| 200 | reduced circuit layout of a Printed Circuit Board (PCBs) for programming and configuration of an integrated flash memory 116 (Flash-2) via a Boundary Scan (BSCAN) register 118 via JTAG interface 102 based on a Boundary Scan Desription Language (BSDL) file in accordance with Standard IEEE 1532, whereby a configuration register 119b in accordance with IEEE Standard 1532 is connected to be the output of the third application-specific integrated circuit 108 (ASIC-3) |
| 202 | fourth application-specific integrated circuit (ASIC-4) for output of the TDO signal via JTAG interface 102 |
| 204 | combined cell of BSCAN registers 118, consisting of the interconnection of a capture cell 204a and a scan cell 204b |
| 204a | Scan or capture cell of configuration register 119b for buffering configuration data or capture cell of BSCAN register 118 for buffering the programming data received from the third application-specific integrated circuit (ASIC-3) |
| 204b | Scan or capture cell of BSCAN register cell 118, needed for controlling a control signal, address or data input of the second flash memory to be programmed 116 (Flash-2) |
| 206 | output-side operational amplifier with adjustable gain factor (VGA) at the output of the scan cell 204b of BSCAN registers 118 responsible for the generation of the relevant control, address or data signal |
| 300 | Detailed views of two exemplary embodiments of circuit layout 200 for connecting multiplexers 302a, 302b1/302b2, 302c and flip-flops 304, 306, 308 of a scan cell 204b of BSCAN registers 118 and a capture cell 204a of configuration register 119b for providing the control, data and address signals needed for programming the flash memory 116 (Flash-2)<br>Variant 1: Use of the first exemplary embodiment 302b1 of the out multiplexer (MUX2)<br>Variant 2: Use of the second exemplary embodiment 302b2 of the out multiplexer (MUX2) and use of configuration update flip-flops 310 (Conf UPD-FF) at the output of capture cells 204a of configuration register 119b |
| 302a | Input multiplexer (MUX1) of a capture cell 204a of BSCAN register 118 for through connecting one of two input signals (DATA_IN, SCAN_IN) depending on a selection signal (SHIFT_DR) present at a control signal input (SEL) |
| 302b | first variant of the output multiplexer (MUX2) of a scan cell 204b of BSCAN register 118 for through connecting one of two input signals (DATA_IN, Conf data) depending on a selection signal (MODE) present at a control signal input (SEL) |
| 302b | second variant of the output multiplexer (MUX2) of a scan cell 204b of BSCAN register 118 for through connecting one of two input signals (DATA_IN, SCAN_OUT, Conf data) in depending on a selection signal (MODE) present at a control signal input (SEL) |
| 302c | Output multiplexer (MUX) of a capture cell 204a of configuration register 119 for through connecting one of two input signals (SCAN_OUT, Conf. data) depending on a selection signal (UPD_DR) present at a control signal input (SEL) |
| 304 | Sacn of capture flip-flop (Scan FF) of a capture cell 204a of BSCAN register 118, realized as edge-triggered delay (D) flip-flop |
| 306 | Update flip-flop (UPD-FF) of a scan cell 204b of BSCAN register 118, realized as a edge-triggered delay (D) flip-flop with inverting clock signal input and a signal input for an ENABLE signal (UPD_DR BSCAN) |
| 308 | Configuration scan or configuration capture flip-flop (Conf Scan-FF) of a capture cell 204a of configuration register 119b, realized as a edge-triggered delay (D) flip-flop |
| 310 | Configuration update flip-flop (Conf UPD-FF) of a capture cell 204a of configuration register 119b, realized as a edge-triggered delay (D) flip-flop with signal input for an ENABLE signal (UPD_DR CONF) with inverting clock signal input |
| TCK | Standard bus signal "Test Clock" of the Test Access Port (TAP) for clocking the TAP controller in accordance with IEEE Standard 1149.1 |
| TDI | Standard bus signal "Test Data In" of the Test Access Port (TAP) for serial shifting in of data via JTAG interface 102 in accordance with IEEE Standard 1149.1 |
| TDO | Standard bus signal "Test Data Out" of the Test Access Port (TAP) for serial shifting out of data via JTAG interface 102 in accordance with IEEE Standard 1149.1 |
| TMS | Standard bus signal "Test Data Select" of the Test Access Port (TAP) for switching over the states of the TAP controller in accordance with IEEE Standard 1149.1 |
| TRST | Standard bus signal "Test Reset" of the Test Access Port (TAP) for asynchronous reset of the TAP controller in accordance with IEEE Standard 1149.1 |

What is claimed is:

1. A method for on-board programming and/or In-System Configuration of a flash memory on a circuit board, comprising:

controlling inputs of the flash memory with an ASIC mounted on the circuit board via individual memory cells of a Boundary Scan register for activation or deactivation of a write operation, wherein an architecture description of the ASIC and the flash memory to be programmed and the data format of the program and configuration data are provided in a file, the printed circuit board is configured to be controlled via an interface for input or output of standard bus signals and for input of the control signals of the ASIC, and the data of the network list or the circuit diagram which define the configuration of the interface between the flash memory to be programmed and the ASIC is provided in additional files.

2. The method according to claim 1, wherein the ASIC and flash memory to be programmed are controlled as a continuous unit.

3. The method according to claim 2, wherein a programming algorithm for programming the flash memory is created automatically by access to the additional file.

4. The method according to claim 1, further comprising simultaneously programming of a number of flash memories on the circuit board via the interface.

5. The method according to claim 1, further comprising providing a data register for buffering the address and control data occurring during burst mode operation, which is connected to the outputs of the ASIC provided for programming the flash memory.

6. A parallel interface for on-board programming and/or In-System Configuration of a flash memory on a printed circuit board by controlling individual inputs of the flash memory with an ASIC mounted on the printed circuit board via memory cells of a Boundary Scan register for activating or deactivating a write operation, wherein the parallel interface is formed by a series connection of a number of memory cells which are part of the Boundary Scan register.

7. A parallel interface for on-board programming and/or In-System Configuration of a flash memory on a printed circuit board by controlling individual inputs of the flash memory with an ASIC mounted on the printed circuit board via memory cells of a Boundary Scan register for activating or deactivating a write operation, wherein the parallel interface is formed by series connection of a number of memory cells of a data register used for In-System Configuration of the flash memory to be programmed.

8. A memory cell of a Boundary Scan register for on-board programming of a flash memory on a printed circuit board by controlling individual inputs of the flash memory with an ASIC mounted on the printed circuit board or activating or deactivating a write operation, comprising:

an input multiplexer for through connecting one of at least two input signals depending on a control signal present at a control signal input, which optionally switches through a connection from the ASIC or from a signal input for Boundary Scan test data to the flash memory;

a scan or capture flip-flop to buffer the programming data or the Boundary Scan test data received from the ASIC;

an update flip-flop for controlling individual control signal, data and/or address inputs of the flash memory to initiate or end a write operation; and an output multiplexer for through connecting one of at least two input signals, depending on a control signal present at a control signal input, which optionally switches through a connection from ASIC or from a signal input for configuration data to flash memory.

9. A memory cell of a data register for In-System Configuration of a flash memory on a printed circuit board by controlling individual inputs of the flash memory with an ASIC mounted on the printed circuit board for activating or deactivating a write operation, comprising:

a scan or capture flip-flop for buffering the configuration data received by the ASIC; and an output multiplexer for through connecting one of two input signals, depending on a control signal present at a control signal input, which optionally switches through a connection from the ASIC or from a signal input for Boundary Scan test data or from a signal input from configuration data to the flash memory.

10. The memory cell according to claim 9, wherein instead of the output multiplexer an update flip-flop is used for controlling individual control signal, data and/or address inputs of the flash memory in order to trigger or end a write operation.

* * * * *